US011539186B2

(12) United States Patent
Siriani et al.

(10) Patent No.: US 11,539,186 B2
(45) Date of Patent: Dec. 27, 2022

(54) SUPERMODE FILTERING WAVEGUIDE EMITTERS

(71) Applicant: Cisco Technology, Inc., San Jose, CA (US)

(72) Inventors: Dominic F. Siriani, Allentown, PA (US); Kenneth J. Thomson, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 966 days.

(21) Appl. No.: 16/294,634

(22) Filed: Mar. 6, 2019

(65) Prior Publication Data

US 2020/0287346 A1 Sep. 10, 2020

(51) Int. Cl.
*H01S 5/00* (2006.01)
*H01S 5/10* (2021.01)
*H01S 5/026* (2006.01)
*H01S 5/22* (2006.01)
*H01S 5/34* (2006.01)
*H01S 5/065* (2006.01)
*H01S 5/50* (2006.01)

(52) U.S. Cl.
CPC ............ *H01S 5/1028* (2013.01); *H01S 5/026* (2013.01); *H01S 5/0265* (2013.01); *H01S 5/0651* (2013.01); *H01S 5/0654* (2013.01); *H01S 5/22* (2013.01); *H01S 5/34* (2013.01); *H01S 5/341* (2013.01); *H01S 5/3412* (2013.01); *H01S 5/50* (2013.01)

(58) Field of Classification Search
CPC ...... H01S 5/1028; H01S 5/026; H01S 5/0265; H01S 5/0651; H01S 5/0654; H01S 5/22; H01S 5/34; H01S 5/341; H01S 5/3412; H01S 5/50
See application file for complete search history.

(56) References Cited

U.S. PATENT DOCUMENTS

| | | | |
|---|---|---|---|
| 5,003,550 A | 3/1991 | Welch et al. | |
| 5,859,866 A * | 1/1999 | Forrest | H01S 5/1032 372/19 |

(Continued)

FOREIGN PATENT DOCUMENTS

EP 2854241 A2 4/2015

OTHER PUBLICATIONS

PCT, International Preliminary Report on Patentability for Application PCT/US2020/020372 dated Aug. 25, 2021.

(Continued)

*Primary Examiner* — Kinam Park
(74) *Attorney, Agent, or Firm* — Patterson + Sheridan, LLP

(57) ABSTRACT

An optical apparatus comprises a semiconductor substrate, and a supermode filtering waveguide (SFW) emitter disposed on the semiconductor substrate. The SFW emitter comprises a first optical waveguide, a spacer layer, and a second optical waveguide spaced apart from the first optical waveguide by the spacer layer. The second optical waveguide is evanescently coupled with the first optical waveguide and is configured, in conjunction with the first waveguide, to selectively propagate only a first mode of a plurality of optical modes. The SFW emitter further comprises an optically active region disposed in one of the first optical waveguide and the second optical waveguide.

17 Claims, 10 Drawing Sheets

(56) References Cited

U.S. PATENT DOCUMENTS

| | | | |
|---|---|---|---|
| 8,994,004 B2* | 3/2015 | Bowers | H01L 31/0232 257/E31.019 |
| 9,274,275 B2 | 3/2016 | Webster et al. | |
| 10,320,151 B1 | 6/2019 | Traverso et al. | |
| 2007/0058685 A1 | 3/2007 | O'Daniel et al. | |
| 2007/0133639 A1 | 6/2007 | Oh et al. | |
| 2007/0189688 A1 | 8/2007 | Dehlinger et al. | |
| 2008/0273567 A1 | 11/2008 | Yariv et al. | |
| 2010/0158429 A1 | 6/2010 | Popovic | |
| 2011/0026880 A1* | 2/2011 | Galli | G02B 6/1228 385/28 |
| 2014/0079082 A1 | 3/2014 | Feng et al. | |
| 2014/0192394 A1* | 7/2014 | Sun | G02F 1/0147 359/238 |
| 2015/0063392 A1* | 3/2015 | Takayama | H01S 5/0287 372/45.01 |
| 2015/0092800 A1* | 4/2015 | Zucker | H01S 5/06808 372/29.015 |
| 2015/0277036 A1 | 10/2015 | Jiang et al. | |
| 2019/0089132 A1 | 3/2019 | Soda | |
| 2019/0214789 A1* | 7/2019 | Santis | G02F 1/35 |
| 2020/0280171 A1 | 9/2020 | Siriani et al. | |

OTHER PUBLICATIONS

Kobayashi et al., "Silicon photonic hybrid ring-filter external cavity wavelength tunable lasers," JLT, 33, 1241-1246, 2015.

O'Brien et al., "Operating characteristics of a high-power monolithically integrated flared amplifier master oscillator power amplifier," IEEE Journal of Quantum Electronics, 29, 2052-2057, 1993.

U.S. Appl. No. 16/366,756, "Variable—Confinement Monolithic Master Oscillator Power Amplifier," as filed on Mar. 27, 2019.

Wenzel et al., "10 W continuous-wave monolithically integrated master-oscillator power-amplifier," Electronics Letters, 43, 160-161, 2007.

Xia etal. "Photonic Integration Using Asymmetric Twin-Waveguide (ATG) Technology: Part I-Concepts and Theory", IEEE Journal of Selected Topics in Quantum Electronics, vol. 11, No. 1, pp. 17-29 (2005). (Year: 2005).

Zhao et al., "High Power Indium Phosphide Photonic Integrated Circuits," Manuscript received Feb. 1, 2019, IEEE, 11 Pages.

PCT Notification of Transmittal of the International Search Report and the Written Opinion of the International Searching Authority, or the Declaration for Application No. PCT/US2020/024716 dated Jul. 10, 2020.

Amnon Yariv et al., "Supermode Si/III-V hybrid lasers, optical amplifiers and modulators: A Proposal and Analysis," Optics Express, vol. 15, No. 15, Jul. 11, 2007, pp. 9147-5273.

Kasper van Gasse Et Al, "27 dB gain III-V-on-Silicon Semi-Conductor optical amplifier with > 17 dBm Output Power," Optics Express, vol. 27, No. 1, Jan. 4, 2019, p. 293.

PCT International Search Report for Application No. PCT/US2020/020372 dated May 26, 2020.

Juodawlkis et al., "High-power, low-noise 1.5-um slab-coupled optical waveguide (SCOW) emitters: physics, devices, and applications," IEEE J. Sel. Top. Quant. Electr., 17, 1698, 2011.

Xia et al., "Photonic Integration Using Asymmetric Twin-Waveguide (ATG) Technology: Part I—Concepts and Theory," IEEE J. Sel. Top. Quant. Electr., 11, 17, 2005. [Abstract Only].

Menon et al., "Photonic Integration Using Asymmetric Twin-Waveguide (ATG) Technology: Part II—Devices," IEEE J. Sel. Top. Quant. Electr., 11, 30, 2005. [Abstract Only].

Gordeev et al., "Transverse single-mode edge-emitting lasers based on coupled waveguides," Opt. Lett., 40, 2150, 2015. [Abstract Only].

Pietrzak et al., "Combination of low-index quantum barrier and super large optical cavity designs for ultranarrow vertical far-fields from high-power broad area lasers," IEEE J. Sel. Top. Quant. Electr., 17, 1715, 2011 [Abstract Only].

Qiu et al., "Design and fabrication of low beam divergence and high kink-free power lasers," IEEE J. Quant. Electr., 41, 1124, 2005. [Abstract Only].

Maximov et al., "High-performance 640-nm-range GaInP-AlGaInP lasers based on the longitudinal photonic bandgap crystal with narrow vertical beam divergence," IEEE J. Quant. Electr., 41, 1341, 2005.

Miah et al., "Astigmatism-free high-brightness 1060 nm edge-emitting lasers with narrow circular beam profile," Opt. Exp., 24, 30514, 2016.

I. Moerman, P. Van Daele, and P. Demeester, "A review on fabrication technologies for the monolithic integration of tapers with III-V semiconductor devices," IEEE J. Select. Topics Quantum Electron., vol. 3, No. 6, pp. 1308-1320, 1997.

U.S. Appl. No. 16/581,923 "Variable Confinement Hybrid Oscillator Power Amplifier,", as filed on Sep. 25, 2019.

Nikita Yu. Gordeev, Alexey S. Payusov, Yuri M. Shemyakov, Sergey A. Mintairov, Nikolay A. Kalyuzhnyy, Marina M. Kulagina, and Mikhail V. Maximov, "Transverse single-mode edge-emitting lasers based on coupled waveguides," Optics Letters, vol. 40, Issue 9, pp. 2150-2152 (2015).

U.S. Appl. No. 16/751,994 "Optical Waveguide Emitter With Turning Waveguide Section," as filed on Jan. 24, 2020.

Kasper et al., "Hybrid III-V/Silicon SOA for Photonic Integrated Circuits," 7 pages, ECOC, 2014.

Zhang et al., "Quantum dot SOA/silicon external cavity multi-wavelength laser," Optic Express, vol. 23, No. 4, 6 pages, 2015.

Zilkie et al., "Power-efficient III-V/ Silcon external Cavity DBR lasers," Optics Express, vol. 20, Issue 21.

Klamkin et al., "High-output saturation power variable confinement slab-coupled optical waveguide amplifier," Optic Fiber Communication Conference and Exposition and the National Fiber Optic Engineers Conference, 2011 [Abstract Only].

Tohmori et al.,"spot-sized converted 1.3 mu m laser with butt-jointed selectively grown vertically tapered waveguide," Electronic Letters, vol. 31, Issue 13, Jun. 22, 1995 [Abstract Only].

Budd et al., "Semiconductor optical amplifier (SOA) packaging for scalable and gain-integrated silicon photonic switching platforms," IEEE 65th Electronic Components and Technology Conference (ECTC), May 2015 [Abstract Only].

Tuorila et al., "Low loss GaInNAs/GaAs gain waveguides with U-bend geometry for single-facet coupling in hybrid photonic integration," Appl. Phys. Lett. 113, 041104, 2018 [Abstract Only].

* cited by examiner

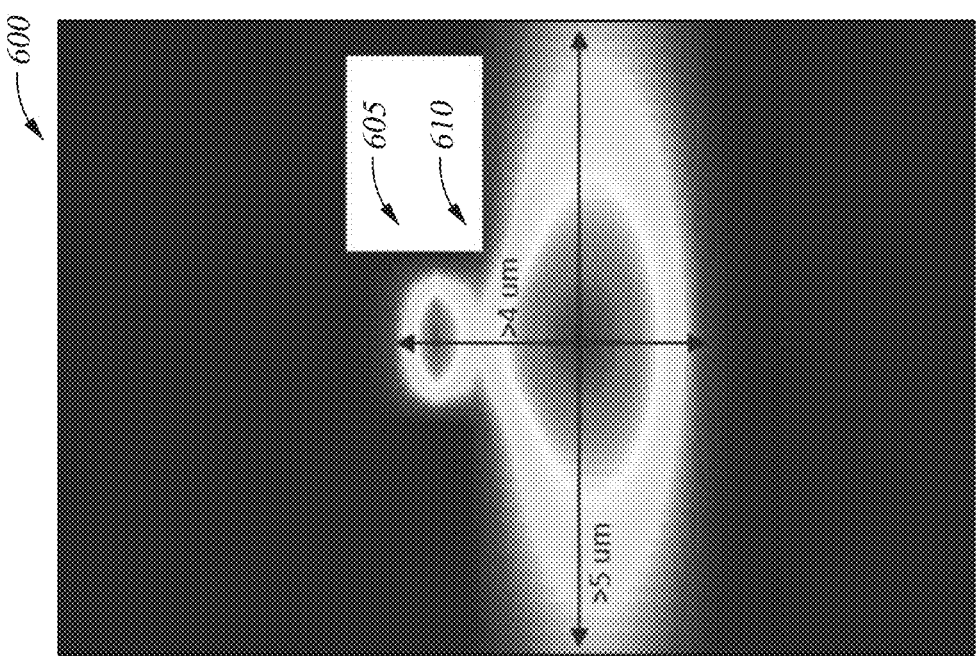
Fig. 6
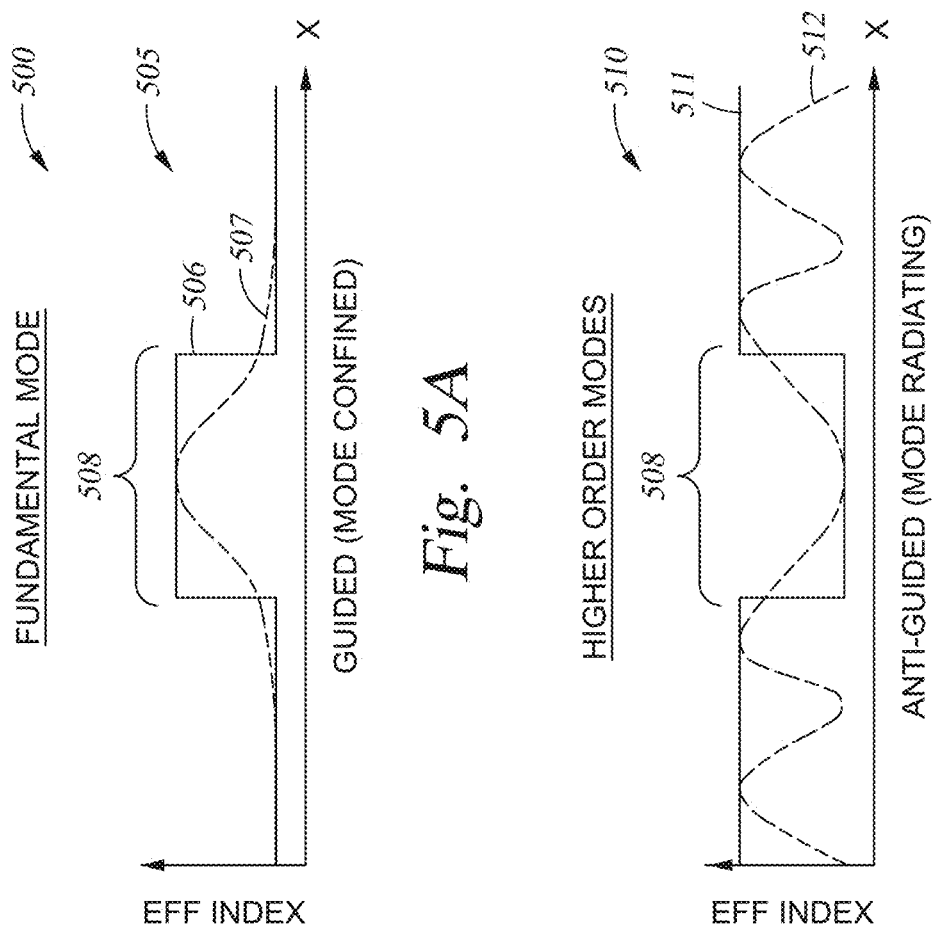
Fig. 5A
Fig. 5B

SUPERMODE FILTERING WAVEGUIDE EMITTERS

TECHNICAL FIELD

Embodiments presented in this disclosure generally relate to a single-mode waveguide emitter formed from two or more vertically stacked waveguides, and more specifically, a waveguide emitter that filters out unwanted modes through lateral radiation.

BACKGROUND

Coherent modulation formats are of primary interest for long-haul and metro applications, and are gaining increased attention for shorter-reach and data center interconnect (DCI) applications. However, coherent modulators in silicon are inherently high-loss due to modulating both phase and amplitude. For upcoming 600 GB, 800 GB, and 1 TB applications, the transmitter insertion loss of the coherent modulators is estimated at 25-29 dB. Meanwhile, the required transmitter output power into the optical fiber is between 0 and +3 dBm.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 5A and 5B are diagrams illustrating filtering of optical modes using a supermode filtering waveguide emitter, according to one or more embodiments.

FIG. 6 is a diagram illustrating propagation of an optical mode using a supermode filtering waveguide emitter, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
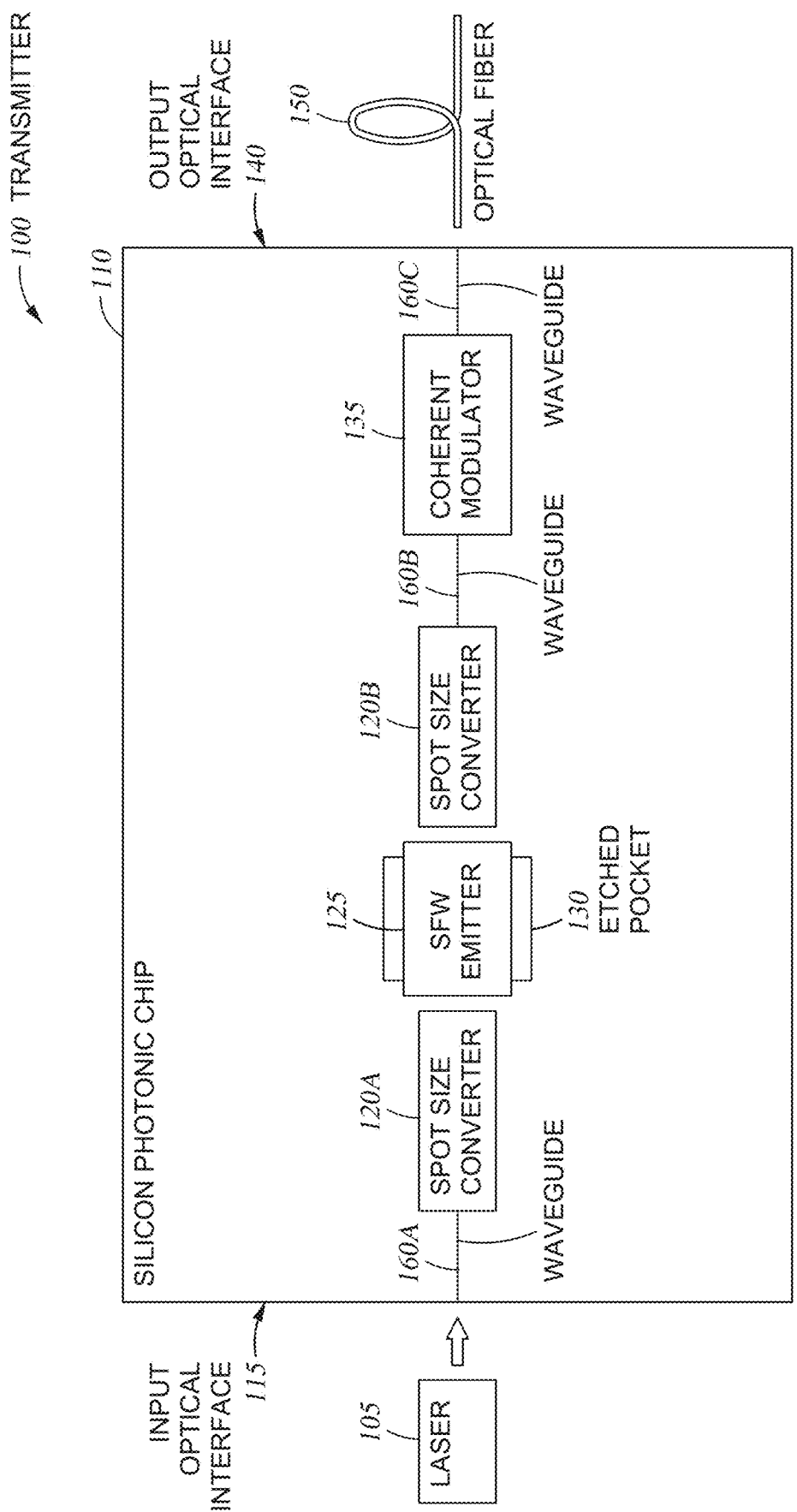
FIG. 1 is a top view of a transmitter with a SCOW emitter mounted on a silicon photonic chip, according to one or more embodiments.

One embodiment presented in this disclosure is an optical apparatus comprising a semiconductor substrate, and a supermode filtering waveguide (SFW) emitter disposed on the semiconductor substrate. The SFW emitter comprises a first optical waveguide, a spacer layer, and a second optical waveguide spaced apart from the first optical waveguide by the spacer layer. The second optical waveguide is evanescently coupled with the first optical waveguide and is configured, in conjunction with the first waveguide, to selectively propagate only a first mode of a plurality of optical modes. The SFW emitter further comprises an optically active region disposed in one of the first optical waveguide and the second optical waveguide.

Another embodiment presented in this disclosure is a method of fabricating a supermode filtering waveguide (SFW) emitter. The method comprises forming a first cladding layer over a semiconductor substrate, forming a first optical waveguide above the first cladding layer, forming a spacer layer above the first optical waveguide, and forming a second optical waveguide above the spacer layer. The second optical waveguide is configured, in conjunction with the first optical waveguide, to selectively propagate only a first mode of a plurality of optical modes. The method further comprises forming an optically active region in one of the first optical waveguide and the second optical waveguide, and forming a second cladding layer over the second optical waveguide.

Another embodiment presented in this disclosure is an optical system comprising a photonic chip comprising an optical component having a predefined height relative to a first surface of the photonic chip, a semiconductor substrate having a second surface, and a supermode filtering waveguide (SFW) emitter contacting the second surface. The SFW emitter comprises a first optical waveguide, a spacer layer, and a second optical waveguide spaced apart from the first optical waveguide by the spacer layer. The second optical waveguide is evanescently coupled with the first optical waveguide and is configured, in conjunction with the first waveguide, to selectively propagate only a first mode of a plurality of optical modes. The SFW emitter further comprises an optically active region disposed in one of the first optical waveguide and the second optical waveguide. When the second surface contacts the first surface, one of the first optical waveguide and the second optical waveguide is optically aligned with the optical component in at least one dimension.

Example Embodiments

To meet the required transmitter output power mentioned above, an Integrated Tunable Laser Assembly (ITLA) would need to achieve +25 to 30 dBm output, or up to 1 Watt. Such a laser may be prohibitive from both cost and power consumption viewpoints. Currently, tunable lasers are only available with +18 dBm output power.

An inline amplifier (e.g., micro erbium-doped fiber amplifier (EDFA)) can be used to relax the required input power from the laser. However, adding the inline amplifier introduces excess noise into the modulated signal, which can significantly reduce transmission distance. As modulation format complexity increases, higher output optical signal-to-noise ratio (OSNR) is desired. For 1 TB optical links, greater than 45 dB OSNR is desired. Thus, no more than 3-4 dB of gain is achievable due to noise introduced by the inline amplifier.

Several additional challenges are encountered with integrating laser sources and other optically active components with a semiconductor-based photonic chip. For example, an efficient coupling of light between the laser source and the photonic chip can require a complex and costly optical alignment process. To support higher data rates (e.g., through faster modulation and/or more optical channels), the laser source may be scaled to higher power levels. In some cases, additional optical components such as lenses and isolators may be needed to protect against optical feedback. In some cases, it may be necessary to attach a laser source to a submount before integrating with the photonic chip, which increases fabrication costs and reduces overall fabrication yields.

According to embodiments discussed herein, an optical apparatus comprises a semiconductor substrate, and a super-mode filtering waveguide (SFW) emitter disposed on the semiconductor substrate. The SFW emitter comprises a first optical waveguide, a spacer layer, and a second optical waveguide spaced apart from the first optical waveguide by the spacer layer. The second optical waveguide is evanescently coupled with the first optical waveguide and is configured, in conjunction with the first waveguide, to selectively propagate only a first mode of a plurality of optical modes. The SFW emitter further comprises an optically active region disposed in one of the first optical waveguide and the second optical waveguide.

Beneficially, the optical apparatus may be more readily integrated with a semiconductor-based photonic chip. The SFW emitter provides an improved coupling efficiency due to a large mode size. Further, the SFW emitter is scalable to higher optical powers due to the large mode size, as well as low intrinsic losses and a low optical confinement factor of the SFW emitter. The optical apparatus enables a large optical waveguide supporting propagation of a single optical mode. In some cases, the shape of the optical mode may be controlled through a selected material stack-up of the SFW emitter. In some cases, the size of the optical mode may be controlled by varying a width of a ridge of the SFW emitter.

Further, the optical apparatus includes a spacer layer between the first optical waveguide and the second optical waveguide. The spacer layer may operate as an etch stop layer, which can simplify the fabrication process and reduce costs of producing the optical apparatus. Still further, the SFW emitter may be integrated directly with a silicon substrate, eliminating a requirement for a separate submount. The silicon substrate offers additional features, such as through-silicon vias (TSVs), precise mechanical features using, e.g., photolithography and wet etching, a high thermal conductivity, a matched coefficient of thermal expansion (CTE) with the photonic chip. Additionally, use of the silicon substrate enables wafer-scale processing, test, and burn-in. Although specifically discussed in terms of a silicon substrate, other implementations are also possible. For example, the SFW emitter may be grown on an indium phosphide (InP) substrate, and then soldered to an aluminum nitride carrier and packaged in a hermetically sealed "gold box".

FIG. 1 is a top view of a transmitter 100 with a SFW emitter 125 mounted on a silicon photonic chip 110, according to one embodiment described herein. The transmitter 100 includes a laser 105 aligned to an input optical interface 115 of the silicon photonic chip 110. In one embodiment, the laser 105 is an integrable tunable laser assembly (ITLA) that outputs a continuous wave (CW) optical signal, but other types of optical sources are also contemplated. That is, the laser 105 outputs an unmodulated optical signal. However, in some cases the output power of the laser 105 is insufficient for performing coherent modulation.

A first waveguide 160A (e.g., a sub-micron waveguide) in the silicon photonic chip 110 routes the CW optical signal to a spot size converter 120A. Because the mode of the CW optical signal in the first waveguide 160A may be much smaller than the mode size of the waveguide in the SFW emitter 125, as the CW optical signal propagates through the spot size converter 120A, the spot size converter 120A increases the size of the optical mode to better match the mode of the waveguide formed by the SFW emitter 125. As such, the optical coupling efficiency between the silicon photonic chip 110 and the SFW emitter 125 is improved.

In FIG. 1, the silicon photonic chip 110 defines an etched pocket 130 in which at least a portion of the SFW emitter 125 is disposed. That is, FIG. 1 provides a top view of the silicon photonic chip 110 where the etched pocket 130 is etched in a direction into the page. The etched pocket 130, which may alternately be a pocket or recess that is formed in any suitable manner, provides a space where the waveguide portion of the SFW emitter 125 can be disposed to align with the first spot size converter 120A at an input interface and with a second spot size converter 120B at an output interface of the SFW emitter 125. The second spot size converter 120B receives the optical signal from the SFW emitter 125 and reduces the mode size so the optical signal better matches the mode size of a second waveguide 160B that is optically coupled with the second spot size converter 120B. Although the spot size converters 120A, 120B are shown as being physically coupled to the first and second waveguides 160A, 160B respectively, one or both of the spot size converters 120A, 120B may be evanescently coupled to the first and second waveguides 160A, 160B.

The amplified CW optical signal generated by the SFW emitter 125 is provided via the second waveguide 160B to a coherent modulator 135 that performs coherent modulation. The coherent modulator 135 modulates the data and outputs a high-bandwidth signal capable of supporting 600 G, 800 G, and 1 TB applications, and so forth. Although the embodiments herein describe using a SFW emitter 125 to amplify a CW optical signal for performing coherent modulation, the embodiments are not limited to such. For example, the SFW emitter 125 can be used to amplify CW optical signals before those signals are transmitted to other types of modulation formats that transmit data at lower speeds. Doing so may permit the use of lower-power lasers 105 which can reduce fabrication costs.

Although the embodiments herein describe using the SFW emitter 125 in a transmitter 100, the spot size converters 120A, 120B and the SFW emitter 125 may be used in other silicon photonic applications such as a laser, a pre-amplifier, a booster amplifier, or an amplifier inside of a lossy photonic integrated circuit (PIC) such as a high port count switch. In these examples, the output of the SFW emitter 125 may be coupled to a different optical component than the coherent modulator 135.

The modulated optical signals generated by the coherent modulator 135 are output onto a third waveguide 160C that is optically coupled with an optical fiber 150 at an output optical interface 140 of the silicon photonic chip 110. Although not shown, the silicon photonic chip 110 may also include spot size converters (e.g., similar to the spot size converters 120A, 120B) at the input optical interface 115 and/or the output optical interface 140 since the mode size of the optical signal generated by the laser 105 and the mode size of the waveguide of the optical fiber 150 may be significantly different from the mode size of the waveguides 160A, 160B, 160C in the photonic chip 110. In another embodiment, the transmitter 100 may include lenses at the input optical interface 115 and/or the output optical interface 140 to compensate for the different mode sizes.

Figure 2:
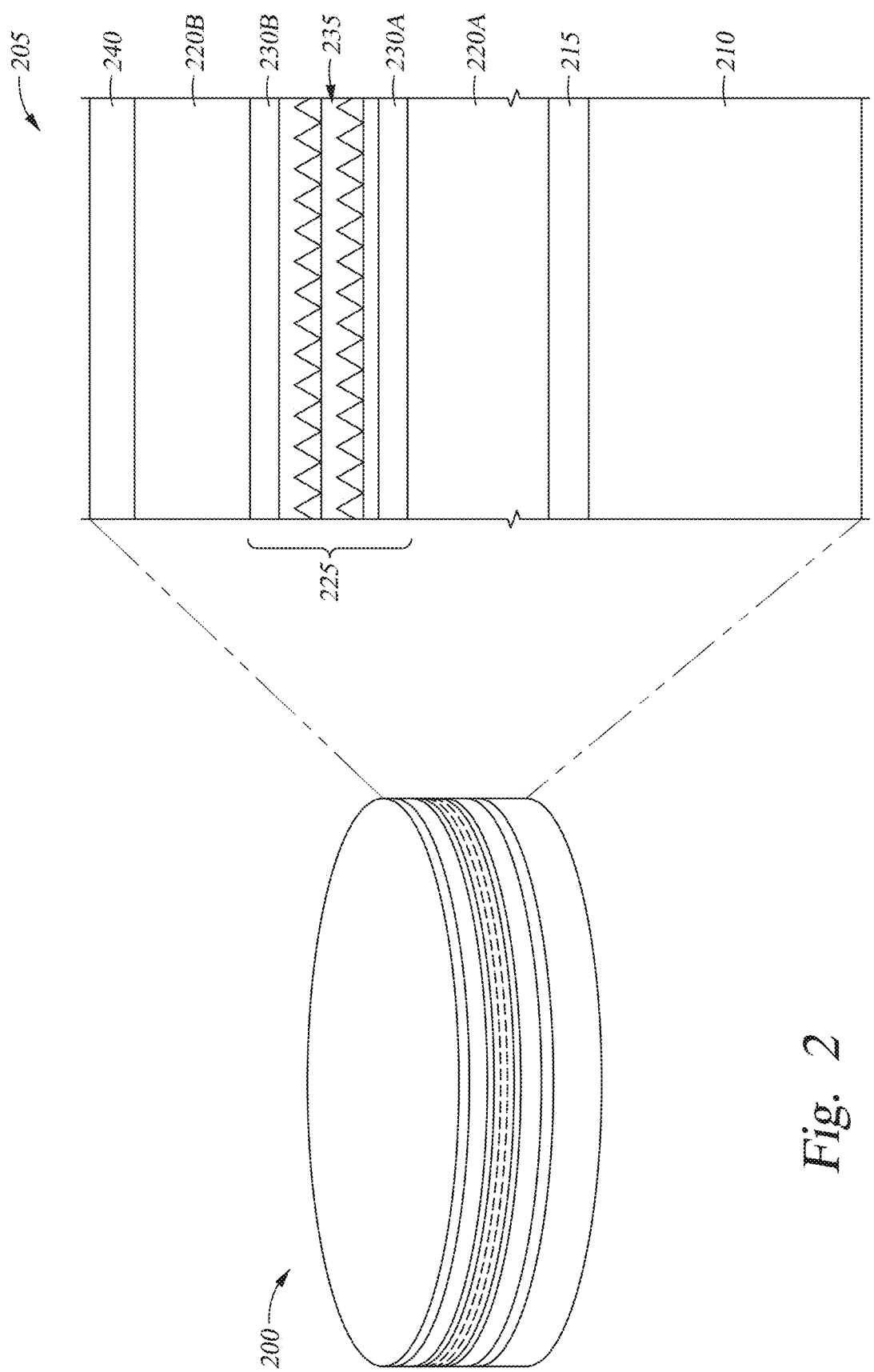
FIG. 2 is a wafer-level view of an exemplary assembly with a quantum dot layer, according to one or more embodiments.

FIG. 2 is a wafer-level view of an exemplary assembly 200 with a quantum dot layer 235, according to one or more embodiments. The assembly 200 may be used in conjunction with other embodiments, such as used to fabricate the SFW emitter 125 of FIG. 1. As shown in cross-sectional detail 205, the assembly 200 comprises a semiconductor wafer 210, a base layer 215 disposed over the semiconductor wafer 210, a first cladding layer 220A disposed over the base layer 215, a waveguide layer 225 disposed over the first cladding layer 220A, a second cladding layer 220B disposed over the waveguide layer 225, and a contact layer 240 disposed over the second cladding layer 220B. Although not shown, in some embodiments, the assembly 200 may include one or more additional waveguide layers and/or one or more spacer layers between the first cladding layer 220A and the waveguide layer 225.

The waveguide layer 225 comprises a first waveguide stratum 230A disposed over the first cladding layer 220A, a quantum dot layer 235 disposed over the first waveguide stratum 230A, and a second waveguide stratum 230B disposed over the quantum dot layer 235. The semiconductor wafer 210 and various layers are not drawn to scale in the cross-sectional detail. Instead, the person of ordinary skill will understand that the absolute and/or relative dimensioning of the semiconductor wafer 210 and various layers may be selected to meet the needs of individual applications.

The semiconductor wafer 210 comprises a semiconductor substrate from which various optical and electrical components may be grown, patterned, etched, deposited, or eutectically bonded. In some embodiments, the semiconductor wafer 210 comprises a bulk silicon (Si) substrate in which one or more features or materials for the active optical device to be produced (e.g., a laser, detector, modulator, absorber) are pre-processed. In various embodiments, the diameter of the semiconductor wafer 210 may range between about 50 millimeters (mm) and about 200 mm, and the thickness may range between about 0.3 mm and about 1 mm. However, the dimensions of the semiconductor wafer 210 may be changed to account for new diameters and thicknesses desired in Si (or other semiconductor material) fabrication industries.

In some embodiments, the base layer 215 comprises a thin film of a III-V semiconductor material that is bonded with the semiconductor wafer 210. The base layer 215 comprises a predetermined thickness of the selected III-V semiconductor material, for example, between about 10 nanometers (nm) and about 1000 nm thick.

In some embodiments, the base layer 215 is formed by bonding a sheet of the III-V semiconductor material to the semiconductor wafer 210, whether directly or indirectly (i.e., via one or more intermediate layers). In some embodiments, a diameter of the sheet is based on the diameter of the semiconductor wafer 210 (e.g., within +/−5% of the wafer diameter), and a thickness of the sheet may vary independently of the thickness of the semiconductor wafer 210 (i.e., thicker, thinner, or the same thickness as the semiconductor wafer 210). In other embodiments, the diameter of the sheet is independent from the diameter of the semiconductor wafer 210. For example, several small sheets may be bonded with the semiconductor wafer 210 having a much larger diameter (e.g., several 50 mm sheets bonded with a 300 mm semiconductor wafer 210). Various methods of bonding the sheet(s) with the semiconductor wafer 210 may be used, which will be familiar to those of ordinary skill in the art. The method of bonding the sheet(s) may differ based on the particular III-V semiconductor material of the sheet(s), and whether any intermediate layers are used. Some non-limiting examples of the III-V semiconductor material of the sheet include a material selected from the boron group (i.e., a group III material: boron, aluminum, gallium, indium, thallium) and a material selected from the nitrogen group (i.e., a group V material: nitrogen, phosphorus, arsenic, antimony, bismuth), such as, for example: boron nitride (BN), gallium nitride (GaN), gallium arsenide (GaAs), and indium phosphide (InP).

In some embodiments, an intermediate layer (not shown) may be sized with a diameter that substantially matches (e.g., +/−1%) the diameter of the semiconductor wafer 210. In some embodiments, the thickness of the intermediate layer is in a range between about 1 nm and about 1000 nm. Some non-limiting examples of materials used in the intermediate layer include dielectrics such as silicon oxide (e.g., $SiO_2$), a polymer, a metal, and a semiconductor. Those of ordinary skill in the art will be familiar with suitable materials that may be used as an intermediate layer.

Further, any of the III-V semiconductor material of the base layer 215, the material of the intermediate layer, and the material of the semiconductor wafer 210 may be doped with various other materials to provide desired physical and/or electrical properties. For example, dopants such as silicon, carbon, zinc, germanium, tin, cadmium, sulfur, selenium, tellurium, beryllium, and/or magnesium may be used to dope the III-V semiconductor material of the base layer 215 for use as an electron emitter or electron collector when used in a semiconductor component. Further, the sheet may be doped prior to, or after, bonding with the semiconductor wafer 210. In another non-limiting example, boron and/or phosphorous may be used as dopants in the semiconductor wafer 210.

In some embodiments, excess material is removed from the sheet after bonding to the semiconductor wafer 210, which provides a desired thickness to the base layer 215. For example, the excess material may be removed from the semiconductor wafer 210 using chemical means, mechanical means, or a combination thereof.

In some embodiments, the first cladding layer 220A and the second cladding layer 220B (which may also be referred to as matrix layers), comprises a lattice-matched material to the III-V semiconductor material of the base layer 215. For example, aluminum gallium arsenide (AlGaAs) may be used for the first cladding layer 220A when GaAs is used for the base layer 215. Other non-limiting examples of lattice-matched materials include indium gallium phosphide (InGaP) with GaAs, and aluminum gallium indium arsenide (AlGaInAs), aluminum indium arsenide (AlInAs), indium gallium arsenide (InGaAs), gallium arsenide antimony (GaAsSb), and indium gallium arsenide phosphide (InGaAsP) with InP. One of ordinary skill in the art will be able to select a lattice-matched material for use with the selected III-V semiconductor material of the base layer 215.

In some embodiments, the first cladding layer 220A and the second cladding layer 220B are epitaxially grown around the waveguide layer 225 and the quantum dot layer 235. In other embodiments, the first cladding layer 220A and the second cladding layer 220B are separately formed, e.g., the first cladding layer 220A is grown from the base layer 215 and the second cladding layer 220B is grown from the second waveguide stratum 230B.

The first waveguide stratum 230A and the second waveguide stratum 230B of the waveguide layer 225 comprise a III-V semiconductor material that is grown to surround the quantum dot layer 235, and which provides a structured gain medium in which the light produced in the quantum dot layer 235 is amplified and is directed outward from the quantum dot layer 235 in one or more directions. In several embodiments, the III-V semiconductor material that comprises the first waveguide stratum 230A and the second waveguide stratum 230B is the same as the III-V semiconductor material of the base layer 215, but may also be made of different III-V semiconductor materials (e.g., AlGaAs when GaAs used for the base layer 215) and/or may be doped differently than the base layer 215. In some embodiments, the first waveguide stratum 230A and the second waveguide stratum 230B are epitaxially grown around the quantum dot layer 235. In other embodiments, the first waveguide stratum 230A is grown from the first cladding layer 220A, and the second waveguide stratum 230B is grown from the quantum dot layer 235.

The quantum dot layer 235 includes a plurality of quantum dots that emit photons when stimulated by an applied electrical current. Quantum dots are nano-structures that exhibit various properties, such as light generation, based on quantum mechanical effects. The quantum dots of the quantum dot layer 235 are surrounded by the first waveguide stratum 230A and the second waveguide stratum 230B of the waveguide layer 225, and are made of materials that have narrower bandgaps than the material of the waveguide layer 225. Quantum dots act as zero-dimensional entities that are embedded in the waveguide layer 225, which enables three-dimensional capture of excited electrons (i.e., preventing movement of the electrons). In contrast, quantum wells are two-dimensional structures formed by a thin layer of a first material surrounded by a wider-bandgap material and that only allow electronic capture in one dimension (allowing planar two-dimensional movement of the electrons). As will be appreciated by one of ordinary skill in the art, the material composition and dimensioning of the quantum dots will affect the properties of the generated light.

The contact layer 240 is made from a III-V semiconductor material. In some embodiments, the contact layer 240 is formed of the same III-V semiconductor material as the base layer 215, and is doped differently than the base layer 215 to form an opposing semiconductor material. For example, when the base layer 215 is p-doped, the contact layer 240 is n-doped, and vice versa. The contact layer 240 forms the most distal layer from the semiconductor wafer 210, and along with the base layer 215 surrounds the quantum dot layer 235, the waveguide layer 225, the first cladding layer 220A, and the second cladding layer 220B. When a sufficient voltage is applied across the contact layer 240 and the base layer 215, an electrical current will flow through the quantum dot layer 235 and generate light.

As will be appreciated, various additional processes may be applied to etch semiconductor wafer 210 and various layers into a desired shape or profile, add one or more photonic elements, and/or process the quantum dot layer 235, which are discussed in greater detail elsewhere in the disclosure. Similarly, various wafer processes may be performed to the semiconductor wafer 210 prior to, or after, bonding and/or growing the various layers. For example, one or more through-silicon vias (TSV) and/or mechanical alignment features may be added to the semiconductor wafer 210, the semiconductor wafer 210 may be diced into individual components, etc., which are discussed in greater detail elsewhere in the disclosure.

Figure 3:
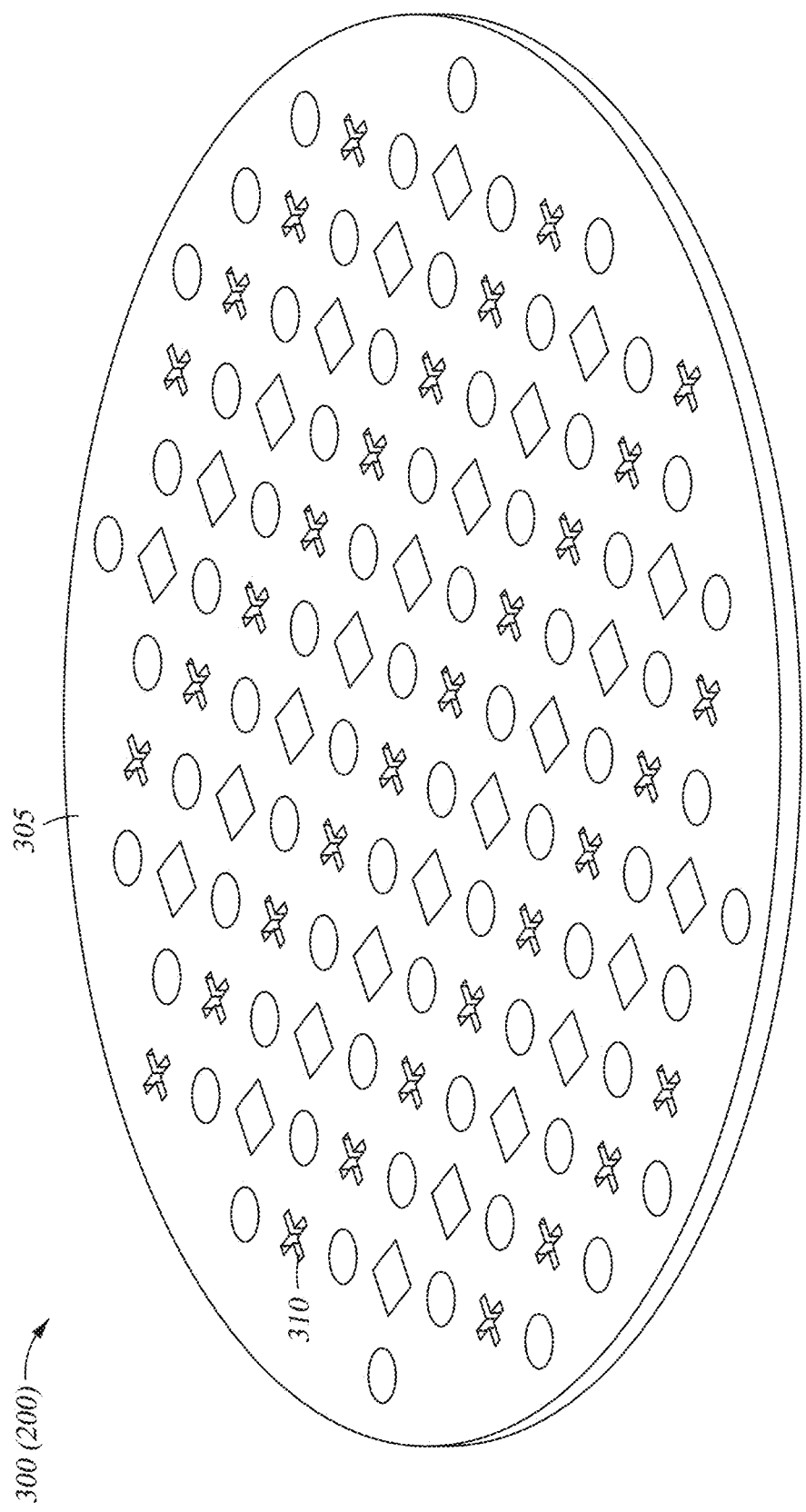
FIG. 3 is a wafer-level view of an exemplary assembly including a plurality of alignment features, according to one or more embodiments.

FIG. 3 is a wafer-level view 300 of an exemplary assembly 200 including a plurality of alignment features 310, according to one or more embodiments. More specifically, the wafer-level view 300 depicts an exterior surface 305 of the assembly 200, e.g., a surface of the semiconductor wafer 210 opposite the base layer 215. As shown, the plurality of alignment features 310 is formed at the exterior surface 305. The plurality of alignment features 310 may be used for aligning the assembly 200 during wafer-scale processing, as well as for aligning the individual components that are subsequently formed (e.g., diced) from the assembly 200.

The plurality of alignment features 310 may have any suitable form(s) in any suitable arrangement relative to the exterior surface 305. The plurality of alignment features 310 may include, but are not limited to: fiducial markers suitable for optical imaging systems (e.g., sets of two to three alignment dots in known positions), mechanical stops, metalized marks, poka-yoke features (e.g., go/no-go features for later fabrication steps), epoxy slots, and other identifying features such as crosshairs, Quick Response (QR) codes, and component callouts/labels.

The plurality of alignment features 310 may include one or more features raised from the exterior surface 305 and/or one or more features recessed (e.g., etched) into the exterior surface 305. As shown, the plurality of alignment features 310 comprises a plurality of differently-shaped features that are arranged into rows. However, other embodiments may include same-shaped features and/or different regular or irregular arrangements.

Figure 4:
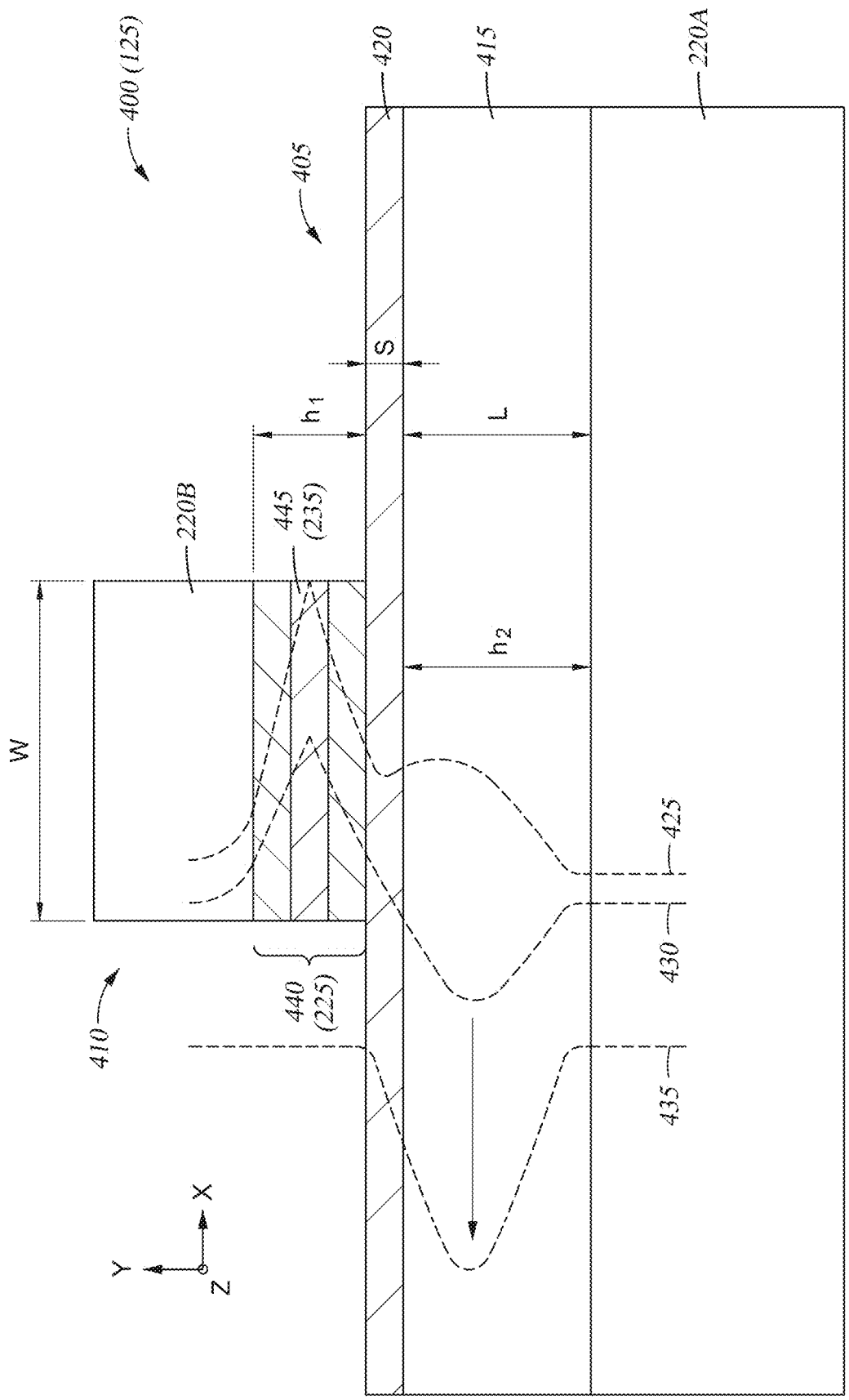
FIG. 4 is a cross-sectional view of a supermode filtering waveguide emitter having an optically active region disposed in a ridge, according to one or more embodiments.

FIG. 4 is a cross-sectional view of a SFW emitter 400 having an optically active region 445 disposed in a ridge portion 410, according to one or more embodiments. The SFW emitter 400 may be used in conjunction with other embodiments, such as being one exemplary implementation of the SFW emitter 125 depicted in FIG. 1.

In the SFW emitter 400, the ridge portion 410 extends from a base portion 405. Generally, the base portion 405 is significantly wider (e.g., along the x-dimension) than the ridge portion 410. As shown, the ridge portion 410 comprises a second optical waveguide 440 and part of a second cladding layer 220B. The base portion 405 comprises a first optical waveguide 415 arranged above the first cladding layer 220A. The first optical waveguide 415 is configured to extend indefinitely (or for a distance much wider than the ridge) in the lateral dimension (e.g., along the x-dimension). The first optical waveguide 415 may have any suitable implementation. For example, where the first cladding layer 220A comprises an indium phosphide (InP) semiconductor material, the first optical waveguide 415 may be formed of gallium indium arsenide phosphide (GaInAsP), aluminum gallium indium arsenide (AlGaInAs), or another suitable quaternary compound semiconductor material. In another example, where the first cladding layer 220A comprises an aluminum gallium arsenide (AlGaAs) semiconductor material, the first optical waveguide 415 may be formed of gallium arsenide (GaAs), AlGaAs with a lower proportion of aluminum, and so forth.

Figure 7:
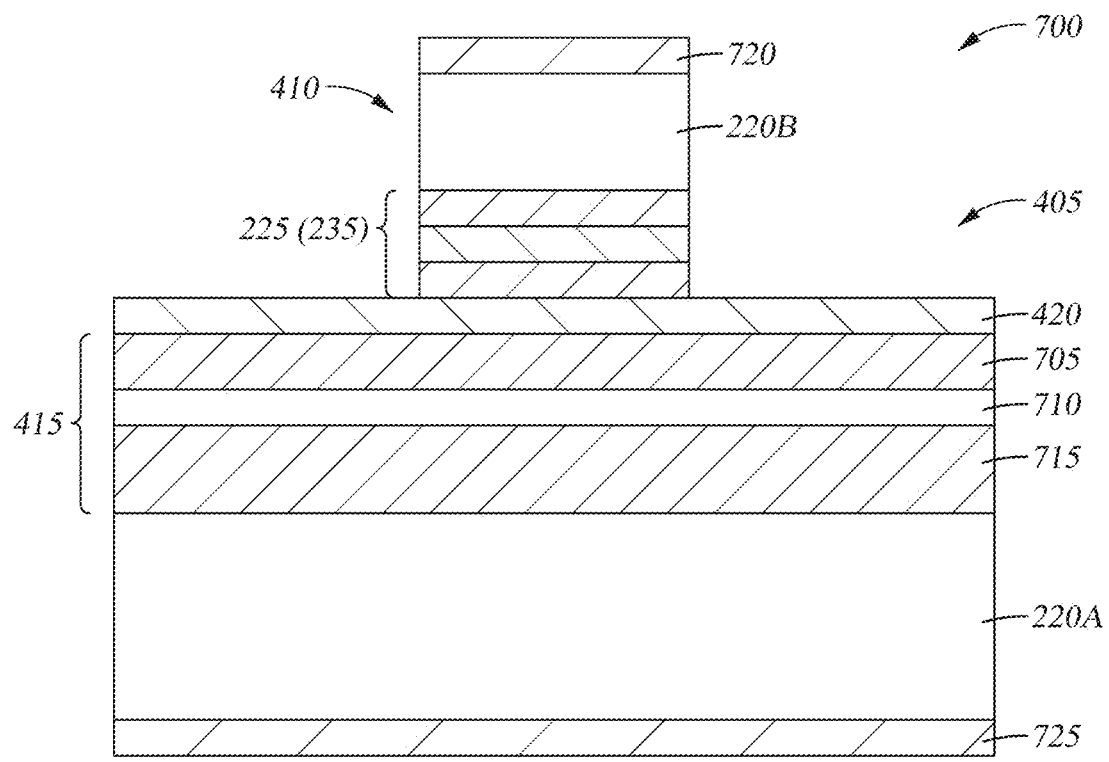
FIGS. 7-10 illustrate alternate implementations of a supermode filtering waveguide emitter, according to one or more embodiments.
Figure 10:
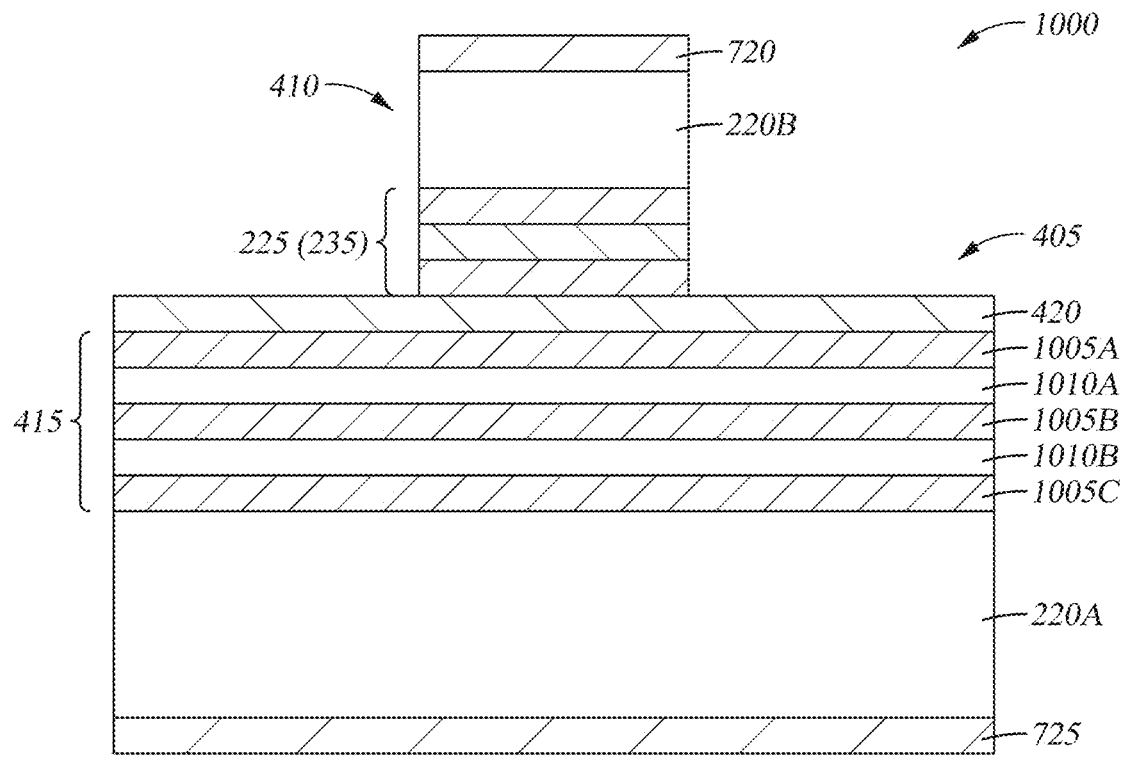

The first optical waveguide 415 has a total thickness (t) along the y-dimension. In some embodiments, and as depicted in FIG. 4, the first optical waveguide 415 comprises a single optical waveguide layer arranged above the first cladding layer 220A and having a height ($h_2$) along the y-dimension. In some embodiments, the height ($h_2$) of the single optical waveguide layer equals the total thickness (t) of the first optical waveguide 415, but this is not a requirement. For example, FIG. 7 depicts the first optical waveguide 415 with two optical waveguide layers separated by a spacer layer, and FIG. 10 depicts the first optical waveguide 415 with an alternating arrangement of high-index and low-index optical waveguide layers (e.g., a dilute waveguide).

The ridge portion 410 comprises a second optical waveguide 440 that is spaced apart from the first optical waveguide 415. The second optical waveguide 440 may have any suitable implementation. For example, where the second cladding layer 220B comprises an indium phosphide (InP) semiconductor material, the second optical waveguide 440 may be formed of gallium indium arsenide phosphide (GaInAsP), aluminum gallium indium arsenide (AlGaInAs), or another suitable quaternary compound semiconductor material. In another example, where the second cladding layer 220B comprises an aluminum gallium arsenide (AlGaAs) semiconductor material, the second optical waveguide 440 may be formed of gallium arsenide (GaAs), AlGaAs with a lower proportion of aluminum, and so forth. In some embodiments, the second optical waveguide 440 is implemented with a same material as the first optical waveguide 415, but this is not a requirement. In some embodiments, the second optical waveguide 440 is formed in the waveguide layer 225.

Figure 8:
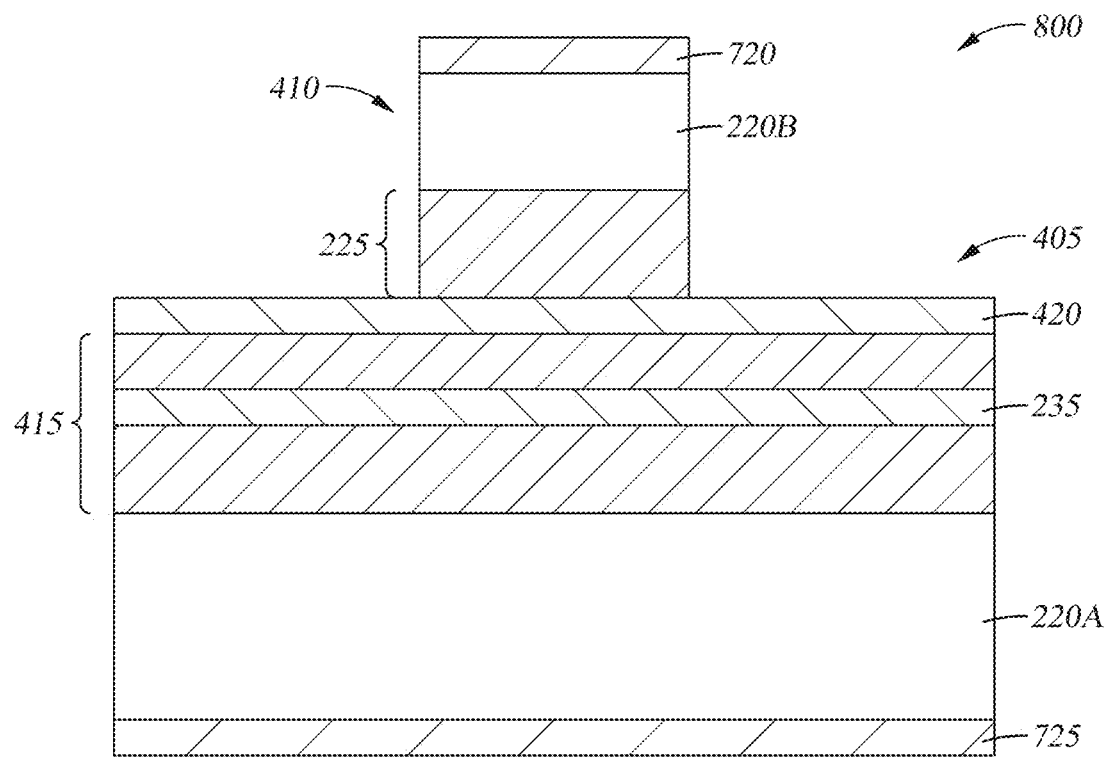

In some embodiments, and as shown in the SFW emitter 400, an optically active region 445 is disposed in the second optical waveguide 440. In alternate embodiments (e.g., as shown in FIG. 8), the active region 445 is disposed in the first optical waveguide 415. Any suitable optical gain material(s) may be used in the optically active region 445, such as quantum wells, quantum dots, quantum wires, etc., which may be electrically pumped and/or optically pumped.

The first waveguide 415 and the second waveguide 440 are spaced apart by a spacer layer 420, and form an evanescently coupled waveguide arrangement. As shown, the first optical waveguide 415 and the second optical waveguide 420 are "vertically stacked", although other relative arrangements are also possible. As such, the effective refractive indices of the modes of the independent first optical waveguide 415 and the second optical waveguide 440 should be appropriately chosen to create a desired supermode that is selectively propagated by the SFW emitter 400. The effective refractive indices can be varied by changing a geometry of the first optical waveguide 415 and/or the second optical waveguide (e.g., a width and thickness) or materials (bulk refractive indices). The materials and thickness of the spacer layer 420 also may be chosen to affect the supermode properties. The arrangement of the first waveguide 415 and the second waveguide 440 can (and generally will) support a plurality of supermodes. However, by virtue of the design of the SFW emitter 400, a fundamental supermode is confined in the ridge portion 410, and all of the other (unwanted) supermodes are filtered out by radiating into the lateral extent of the first optical waveguide 415. Thus, a single mode may be selectively propagated by the SFW emitter 400.

Referring also to FIG. 2, for those embodiments in which the second optical waveguide 440 is formed in the waveguide layer 225, the first waveguide stratum 230A represents a first region that is doped with a first conductivity type, and the second waveguide stratum 230B represents a second region that is doped with a different, second conductivity type. The active region 445 (e.g., the quantum dot layer 235) is disposed between the first waveguide stratum 230A and the second waveguide stratum 230B. The first optical waveguide 415 may have any suitable doping or may be undoped.

In some embodiments, the waveguide layer 225 is formed from a III-V semiconductor material or alloy, and has a thickness between about 1 and 2 microns. In some embodiments, a width of the ridge portion 410 (w) along the x-dimension is between about 3 and 8 microns. With such dimensioning, a diameter of the optical mode may be about 4 and 5 microns, which is much larger than most semiconductor optical amplifiers (SOAs) that support single mode amplification. As the mode size increases, the optical signal typically has multiple modes. However, the SFW emitter 400 can have a large mode size and still support single mode amplification because of regions 405A, 405B of the first waveguide(s) 405 away from the ridge portion 410. As an optical signal propagating in the SFW emitter 400 generates additional modes, these modes are transmitted into, and filtered out, by the regions 405A and 405B. In this manner, the SFW emitter 400 supports single mode operation at larger mode sizes supported by other SOAs. In one embodiment, the SFW emitter 400 is a multi-mode amplifier with a vertical mode size of the fundamental mode greater than 2.5 microns $1/e^2$ diameter, which can have significantly higher mode gain than any other higher order modes. In one embodiment, the SFW emitter 400 is a single-mode amplifier with a mode size of the fundamental mode greater than 2.5 microns $1/e^2$ diameter; other modes supported by the waveguide experience a net loss because of the radiation loss to 405A and 405B. The relationship $1/e^2$ is a typical metric for describing the size of a Gaussian beam.

A spacer layer 420 is disposed between the first optical waveguide 415 and the second optical waveguide 440. The spacer layer 420 may have any suitable implementation, such as InP or a suitable quaternary compound semiconductor material. Further, the spacer layer 420 may have any suitable doping or may be undoped. The spacer layer 420 has a height (s) along the y-dimension.

The first optical waveguide 415, the second optical waveguide 440, and/or the spacer layer 420 are dimensioned and arranged such that the first optical waveguide 415 and the second optical waveguide 440 are evanescently coupled. Through the evanescent coupling, the combination of the first optical waveguide 415 and the second optical waveguide 440 are configured to propagate a coupled supermode representing a sum of the modes of the first optical waveguide 415 and the second optical waveguide 440.

In some embodiments, the second optical waveguide 440 is configured to propagate a plurality of optical modes (illustrated as effective index plots 425, 430, 435), and the first optical waveguide 415 is configured to selectively propagate a first mode of the plurality of optical modes. Described another way, a fundamental coupled mode (illustrated by the effective index plot 425) has an effective index that is greater than that of the first optical waveguide 415, and higher-order coupled modes (illustrated by the effective index plots 430, 435) have effective indexes that are less than that of the first optical waveguide 415. The effective index presented by the first optical waveguide 415 is illustrated in graphs 505, 510 of FIG. 5. In the graph 505, an effective index 506 is greater for a fundamental coupled mode 507 in a region 508 corresponding to the ridge portion 410 of the SFW emitter 400. In the graph 510, an effective index 511 is lesser for higher-order coupled modes 512 in the region 508. Thus, the fundamental coupled mode (e.g., an in-phase optical mode) is confined by the first optical waveguide 415, while the higher-order coupled modes (e.g., out-of-phase optical modes) are radiated away by the first optical waveguide 415.

According to the coupled mode theory for evanescently coupled waveguides, the coupled system of two waveguides supports two supermodes (an in-phase mode and an out-of-phase mode) whose field profiles are approximately described by the superposition of the individual waveguide modes. The effective indices of these modes can be described by the equations $n_{eff}^+ = n + [\Delta n^2 + K^2]^{1/2}$ (in-phase) and $n_{eff}^- = n - [\Delta n^2 + K^2]^{1/2}$ (out-of-phase), where n is the effective indices of the two waveguides averaged, $\Delta n$ is the half the difference of the two waveguides' effective indices, and K is related to the coupling strength between the two waveguides. For the SFW in the region where the upper waveguide is etched away, the mode effective index is approximately equal to the effective index of the lower waveguide(s) alone, which is expressed as $n_{eff}^1 = n +/- \Delta n$ (sign depending on how the difference between waveguide effective indices is taken). It is apparent that $n_{eff}^+ > n_{eff}^1 > n_{eff}^-$ for $K^2 > 0$. Since in general a mode is pulled into the region with higher refractive index, it follows that the in-phase mode is confined in the ridge portion 410, whereas the out-of-phase mode is pulled into the lateral region (with upper waveguide etched away) where it radiates away from the ridge portion 410 and the optical power is lost. By this principle, the desired in-phase mode is confined to the ridge portion 410, while the unwanted out-of-phase supermode is filtered out by radiating away.

Referring also to FIG. 6, a diagram 600 illustrates face-view of an optical mode using the SFW emitter 400. In some embodiments, a width (w) of the ridge portion 410 is greater than 4 microns along the x-dimension, and the coupled waveguide geometry of the SFW emitter 400 has a thickness (e.g., $h_1 + s + t$) of greater than 4 microns along the y-dimension. Other sizing of the SFW emitter 400 is also contemplated. A first optical mode portion 605 propagates through the second optical waveguide 440, and a second optical mode portion 610 propagates through the first optical waveguide 415. Thus, the SFW emitter 400 supports propagating an optical mode that is greater than 5 microns along the x-dimension, and greater than 4 microns along the y-dimension.

Beneficially, the large size of the optical mode allows for better coupling efficiency and alignment tolerance, which enables passive alignment and bonding of the SFW emitter 400. The large size of the optical mode permits generation of very high optical power levels, e.g., 100 milliwatts to 1 watt or greater, which is approximately an order of magnitude greater than conventional diode lasers. Further, the amplification generated by the SFW emitter 400 can compensate for the higher losses suffered when data rates are increased. For example, the SFW emitter 400 can be used in a transmitter that has an optical signal greater than 50 GHz and supporting data rates between 100 Gbps and 1 Tbps.

The compositions and geometries of the first optical waveguide 415 and/or the second optical waveguide 440 may be selected to control a size and/or shape of the optical mode. FIGS. 7-10 illustrate alternate implementations of the SFW emitter 400. While each of the alternate implementations is shown with a number of features different from the SFW emitter 400, any suitable combination of the features is contemplated.

For example, in the SFW emitter 700 of FIG. 7, the first optical waveguide 415 comprises a first optical waveguide layer 705 spaced apart from a second optical waveguide layer 715, and a second spacer layer 710 arranged between the first optical waveguide layer 705 and the second optical waveguide layer 715. The first optical waveguide layer 705 and/or the second optical waveguide layer 715 may have any suitable implementation, such as GaInAsP, AlGaInAs, GaAs, AlGaAs with a lower proportion of aluminum, or a suitable quaternary compound semiconductor material. In some embodiments, the first optical waveguide layer 705 and/or the second optical waveguide layer 715 are implemented with a same semiconductor material as the first optical waveguide 415 and/or the second optical waveguide 440, but this is not a requirement. Further, the first optical waveguide layer 705 and/or the second optical waveguide layer 715 may have any suitable doping, or may be undoped.

The second spacer layer 710 may have any suitable implementation, such as InP or a suitable quaternary compound semiconductor material. In some embodiments, the second spacer layer 710 is implemented with a same semiconductor material as the spacer layer 420, but this is not a requirement. Further, the second spacer layer 710 may have any suitable doping or may be undoped.

A first conductive contact layer 720 is arranged above the second cladding layer 220B (e.g., an upper cladding layer). A second conductive contact layer 725 arranged beneath the first cladding layer 220A (e.g., a lower cladding layer). In such a case, the second cladding layer 220B and the second waveguide stratum 230B of the waveguide layer 225 may be doped with a first conductivity type. The first cladding layer 220A, the first waveguide stratum 230A of the waveguide layer 225, and/or the first optical waveguide layer 705 and the second optical waveguide layer 715 may be doped with a different, second conductivity type. In some embodiments, the spacer layer 420 is also doped to be electrically conductive.

In the SFW emitter 800 of FIG. 8, the optically active region 445 is disposed in the first optical waveguide 415 (i.e., in the base portion 405). A first optical waveguide layer 805 of the first optical waveguide 415 is arranged beneath the spacer layer 420 and above the optically active region 445, and a second optical waveguide layer 810 of the second optical waveguide 415 is arranged beneath the optically active region 445 and above the first cladding layer 220A.

The first optical waveguide layer 805 and/or the second optical waveguide layer 810 may have any suitable implementation, such as such as GaInAsP, AlGaInAs, GaAs, AlGaAs with a lower proportion of aluminum, or a suitable quaternary compound semiconductor material. In some embodiments, the first optical waveguide layer 805 and/or the second optical waveguide layer 810 is implemented with a same semiconductor material as the first optical waveguide 415 and/or the second optical waveguide 440, but this is not a requirement.

The first conductive contact layer 720 is arranged above the second cladding layer 220B, and the second conductive contact layer 725 arranged beneath the first cladding layer 220A. In such a case, the first optical waveguide layer 805, the waveguide layer 225, and the second cladding layer 220B may be doped with a first conductivity type, and the second optical waveguide layer 810 and the first cladding layer 220A may be doped with a different, second conductivity type.

Figure 9:
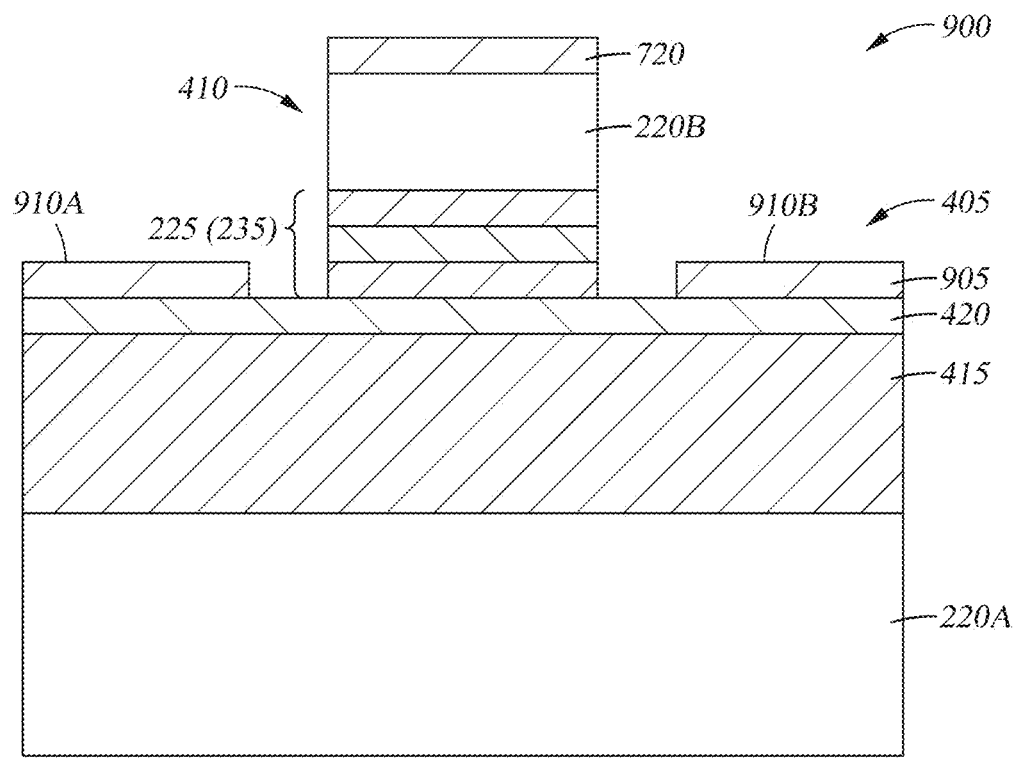

In the SFW emitter 900 of FIG. 9, the first conductive contact layer 720 is arranged above the second cladding layer 220B, and the second conductive contact layer 905 is arranged above the spacer layer 420. Within the second conductive contact layer 905, conductive contacts 910A, 910B are arranged on opposite sides of the ridge portion 410. Beneficially, as the optical field is relatively low in the conductive paths across the spacer layer 420 to the first waveguide stratum 230A of the waveguide layer 225, in some cases the first optical waveguide 415 may be undoped, which reduces optical losses in the first optical waveguide 415.

In the SFW emitter 1000 of FIG. 10, the first optical waveguide 415 comprises a dilute waveguide having an alternating arrangement of high effective index layers 1005A, 1005B, 1005C and low effective index layers 1010A, 1010B. Although three (3) high effective index layers 1005A, 1005B, 1005C and two (2) low effective index layers 1010A, 1010B are shown, any alternate numbers are also contemplated. Further, the dimensioning of the high effective index layers 1005A, 1005B, 1005C and the low effective index layers 1010A, 1010B (e.g., along the y-dimension) may be controlled to provide a desired size and shape of the optical mode.

Figure 11:
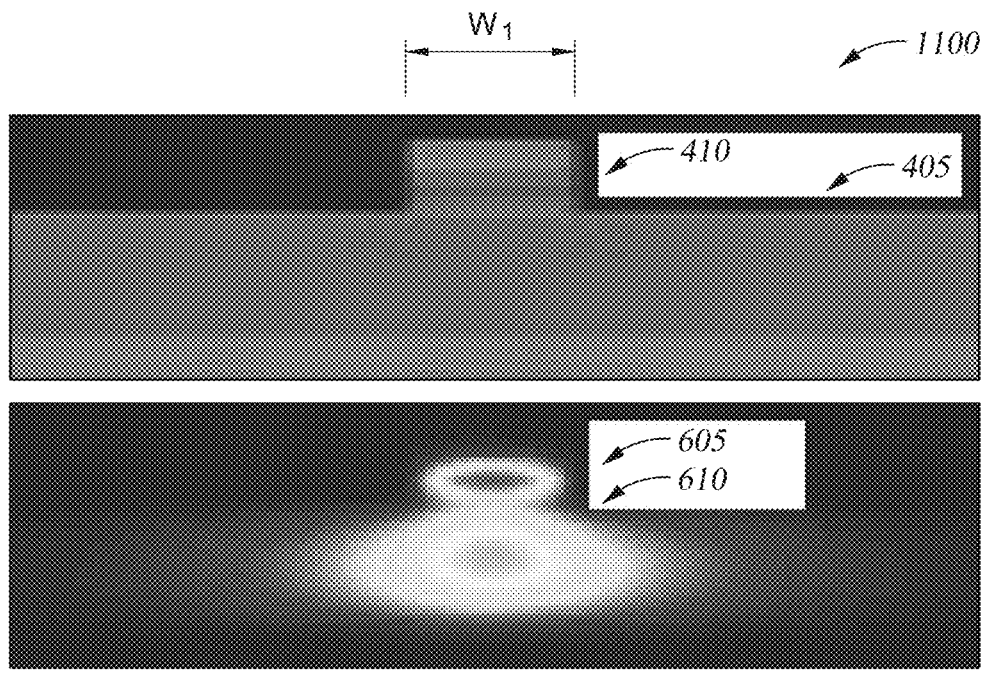
FIGS. 11 and 12 illustrate altering the confinement of an optical mode, according to one or more embodiments.
Figure 12:
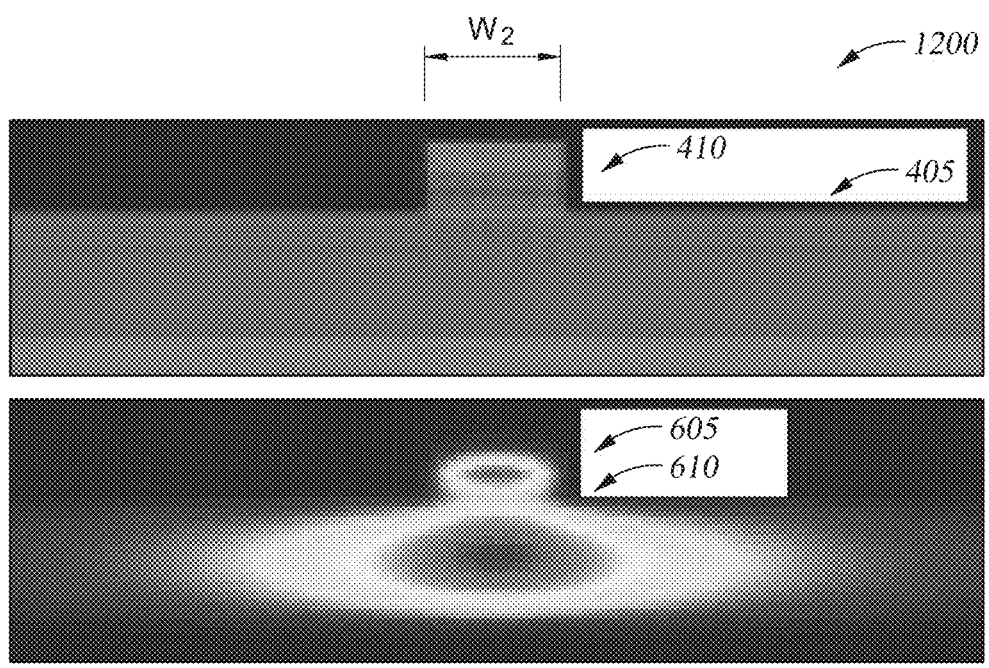

FIGS. 11 and 12 illustrate altering the confinement of an optical mode, according to one or more embodiments. The features illustrated in diagrams 1100, 1200 may be used in conjunction with other embodiments, such as with any of the SFW emitters 400, 700, 800, 900, 1000.

In the diagram 1100 (e.g., representing a first cross-section view of the SFW emitter), the ridge portion 410 and the second optical waveguide 440 have a width W1 along the x-dimension. In the diagram 1200 (e.g., representing a second cross-section view of the SFW emitter), the ridge portion 410 and the second optical waveguide 440 have a width W2 that is less than width W1. The SFW emitter having the width W1 provides a relatively greater confinement in the second optical waveguide 440, resulting in a relatively greater optical intensity of the first optical mode portion 605, and a relatively lesser optical intensity of the of second optical mode portion 610. The SFW emitter having the width W2 provides a relatively lesser confinement in the second optical waveguide 440 (compared to the width W1), resulting in a relatively lesser optical intensity of the first optical mode portion 605, and a relatively greater optical intensity of the of second optical mode portion 610.

In this way, the second optical waveguide 440 has different widths along a length of the ridge portion 410 (as shown, extending into and out of the page). Thus, by adjusting the width of the ridge portion 410 and the second waveguide 440, the SFW emitter may be used to provide a variable confinement SOA, e.g., where high optical gain is required in one region and high optical power is required in another region. Additionally, by adjusting the width of the ridge portion 410 and the second waveguide 440, the SFW emitter may be used to provide an optical apparatus with a large optical mode at an external interface and small optical mode in the bulk of the optical apparatus.

Figure 13:
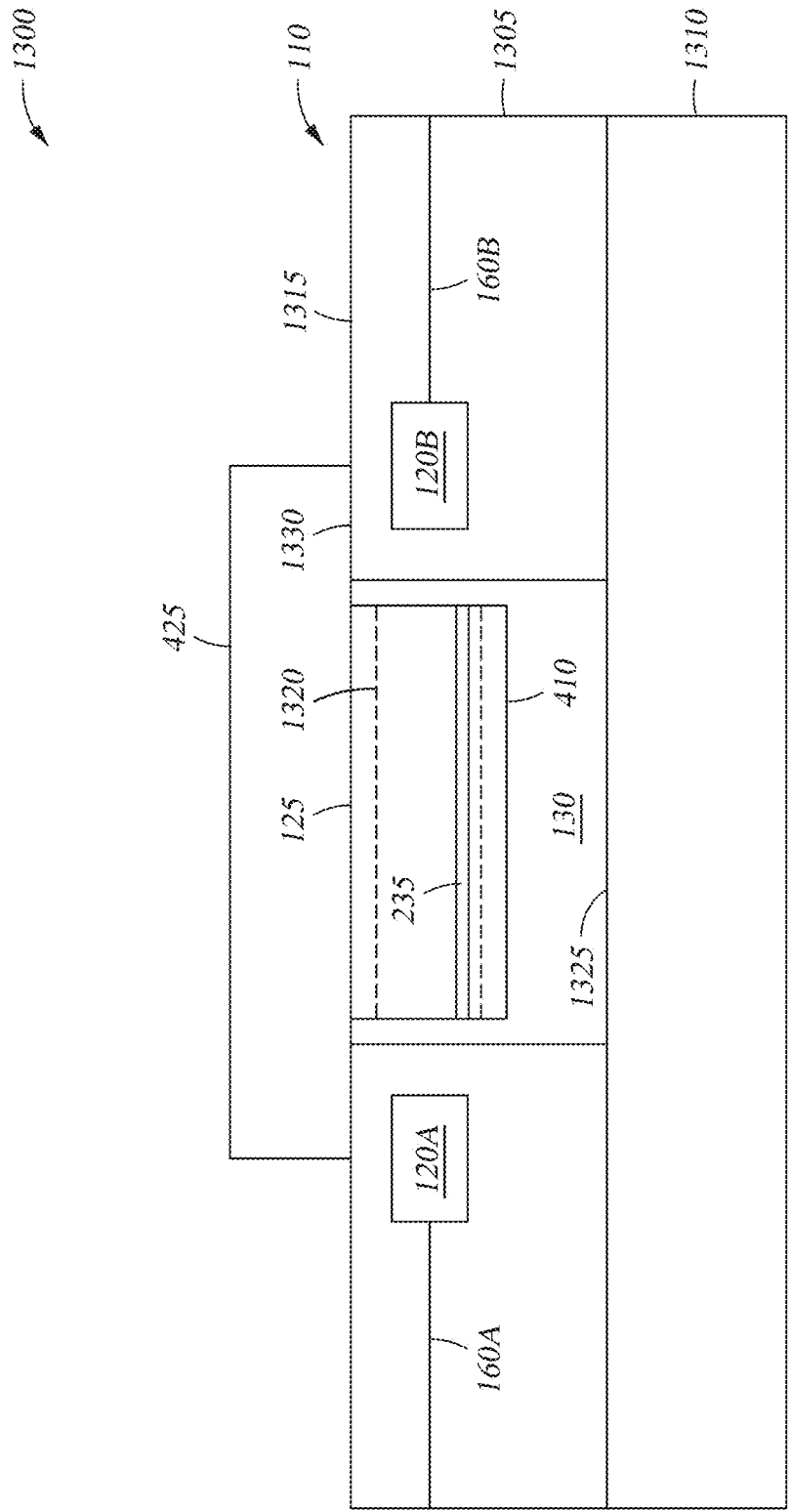
FIG. 13 is a side view of a supermode filtering waveguide emitter mounted on a silicon photonic chip, according to one or more embodiments.

FIG. 13 is a side view 1300 of a SFW emitter 125 mounted on a silicon photonic chip 110, according to one or more embodiments. The features depicted in the side view 1300 may be used in conjunction with other embodiments, e.g., such as with any of the SFW emitters 400, 700, 800, 900, 1000.

The silicon photonic chip 110 includes an insulator layer 1305 (e.g., an interlayer dielectric (ILD) disposed on a silicon substrate 1310 (e.g., a monocrystalline silicon substrate). During fabrication, the insulator layer 1305 is processed to form the spot size converters 120A, 120B which transfer an optical signal into, and receive an amplified optical signal from, the SFW emitter 125 as well as the waveguides 160A, 160B (e.g., silicon nitride or silicon oxynitride waveguides).

As shown, the SFW emitter 125 is arranged within the etched pocket 130 formed in the insulator layer 1305, such that respective ends of a waveguide 1320 in the SFW emitter 125 (shown generally by the dashed lines) are aligned with the spot size converters 120A, 120B. As shown, the etched pocket 130 extends fully through the insulator layer 1305 to a surface 1325 of the silicon substrate 1310. In other embodiments, however, the etched pocket 130 extends only partly through the insulator layer 1305. The SFW emitter 125 includes a ridge portion 410 and an optically active region 445 (e.g., formed in a quantum dot layer) which confine the optical signal within the waveguide 1320 and provide optical amplification. The functions of these components are discussed in greater detail above.

As shown, a submount 1335 such as a silicon substrate is disposed above the insulator layer 1305. When aligning the SFW emitter 125 with the spot size converters 120A, 120B, an external surface 1330 of the submount 1335 is brought into contact with an external surface 1315 (e.g., a top surface of the insulator layer 1305) of the silicon photonic chip 110. Although not shown, an adhesive may be used to fasten the submount 1335 to the external surface 1315 to thereby maintain the alignment between the waveguide 1320 and the spot size converters 120A, 120B.

In one embodiment, the SFW emitter 125 includes at least two conductive contacts for providing power to perform optical amplification on an optical signal propagating through the waveguide 1320. In one example, the two conductive contacts are disposed on a top surface of the submount 1335 (e.g., outside the etched pocket 130) and are wire bonded or otherwise electrically coupled with a power source on the silicon photonic chip 110 or another chip. In another example, at least one conductive contact is disposed on the top surface of the submount 1335 while another electrode is disposed on a bottom surface of the ridge portion 410 (e.g., the side of the ridge portion 410 facing with the surface 1325). In this case, the silicon photonic chip 110 may include an electrode on the surface 1325, which is then soldered or otherwise electrically coupled with the conductive contact disposed on the bottom surface of the ridge portion 410 for providing power to the SFW emitter 125.

Figure 14:
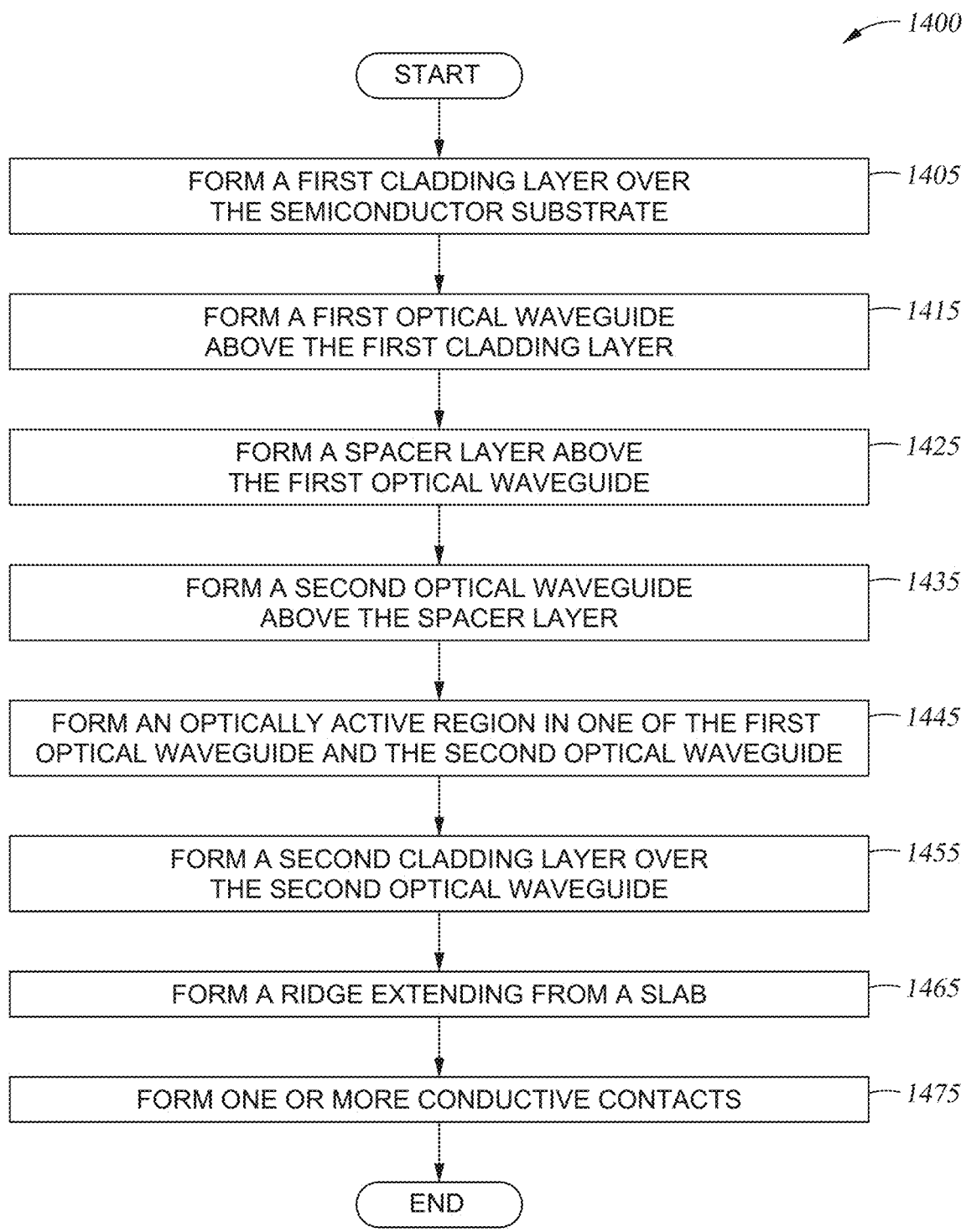
FIG. 14 is a method of fabricating a SCOW emitter, according to one or more embodiments.

FIG. 14 is a method 1400 of fabricating a SFW emitter, according to one or more embodiments. The method 1400 may be used in conjunction with other embodiments, such as fabricating any of the SFW emitters 400, 700, 800, 900, 1000.

The method 1400 begins at block 1405, a first cladding layer is formed over the semiconductor substrate. At block 1415, a first optical waveguide is formed above the first cladding layer. At block 1425, a spacer layer is formed above the first optical waveguide. At block 1435, a second optical waveguide is formed above the spacer layer. At block 1445, an optically active region is formed in one of the first optical waveguide and the second optical waveguide. In some embodiments, block 1445 is performed as part of block 1435: a lower portion of the second optical waveguide is formed above the spacer layer, the optically active region is formed above the lower portion, and an upper portion of the second optical waveguide is formed above the optically active region. At block 1455, a second cladding layer is formed above the second optical waveguide (e.g., above the upper portion of the second optical waveguide). At block 1465, a ridge extending from a slab is formed. In some embodiments, an etching process is used to form the ridge, and the spacer layer operates as an etch stop layer. At block 1475, one or more conductive contacts are formed. In some embodiments, the one or more conductive contacts are formed above the second cladding layer (e.g. on the ridge), and either (1) above the spacer layer or (2) beneath the first cladding layer (e.g., after separation from the semiconductor substrate). The method 1400 ends following completion of block 1465.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical apparatus comprising:
   a semiconductor substrate; and
   a supermode filtering waveguide (SFW) emitter disposed on the semiconductor substrate and formed as a ridge portion extending from a base portion, the SFW emitter comprising:
   a first optical waveguide disposed in the base portion;
   a spacer layer;
   a second optical waveguide disposed in the ridge portion and spaced apart from the first optical waveguide by the spacer layer, wherein the second optical waveguide is evanescently coupled with the first optical waveguide and configured in conjunction with the first optical waveguide to selectively propagate only a first mode of a plurality of optical modes; and
   an optically active region disposed in one of the first optical waveguide and the second optical waveguide.

2. The optical apparatus of claim 1, wherein the first optical waveguide comprises:
   a first optical waveguide layer spaced apart from a second optical waveguide layer; and
   a second spacer layer arranged between the first optical waveguide layer and the second optical waveguide layer.

3. The optical apparatus of claim 1, wherein the first optical waveguide in the base portion is dimensioned to filter out one or more other modes of the plurality of optical modes.

4. The optical apparatus of claim 1, wherein the optically active region is disposed in the ridge portion.

5. The optical apparatus of claim 1, wherein the optically active region is disposed in the base portion.

6. The optical apparatus of claim 1,
   wherein the second optical waveguide has different widths along a length of the ridge portion, and
   wherein the different widths alter a confinement of the first mode as an optical signal propagates through the second optical waveguide.

7. The optical apparatus of claim 1, further comprising:
   an upper cladding layer arranged above the spacer layer;
   a first conductive contact layer arranged above the upper cladding layer;
   a lower cladding layer arranged beneath the first optical waveguide; and
   a second conductive contact layer arranged at one of: (1) above the spacer layer, and (2) beneath the lower cladding layer.

8. The optical apparatus of claim 1, wherein the first optical waveguide comprises an alternating arrangement of high effective index layers and low effective index layers.

9. The optical apparatus of claim 1, wherein the optically active region comprises one or more of quantum wells, quantum dots, and quantum wires.

10. A method of fabricating a supermode filtering waveguide (SFW) emitter, the method comprising:
    forming a first cladding layer over a semiconductor substrate;

forming a first optical waveguide above the first cladding layer;

forming a spacer layer above the first optical waveguide;

forming a second optical waveguide above the spacer layer by forming a ridge portion extending from a base portion, wherein the first optical waveguide is disposed in the base portion, wherein the second optical waveguide is disposed in the ridge portion, and wherein the second optical waveguide is configured, in conjunction with the first optical waveguide, to selectively propagate only a first mode of a plurality of optical modes;

forming an optically active region in one of the first optical waveguide and the second optical waveguide; and forming a second cladding layer over the second optical waveguide.

11. The method of claim 10, wherein the first optical waveguide in the base portion is dimensioned to filter out one or more other mode of the plurality of optical modes.

12. The method of claim 10, wherein forming the ridge portion comprises:

etching to the spacer layer through at least the second cladding layer.

13. The method of claim 10, wherein the second optical waveguide is formed with different widths along a length of the ridge portion, and wherein the different widths alter a confinement of the first mode as an optical signal propagates through the second optical waveguide.

14. An optical system comprising:

a photonic chip comprising an optical component having a predefined height relative to a first surface of the photonic chip;

a semiconductor substrate having a second surface; and a supermode filtering waveguide (SFW) emitter contacting the second surface and formed as a ridge portion extending from a base portion, the SFW emitter comprising:

a first optical waveguide disposed in the base portion;

a spacer layer;

a second optical waveguide disposed in the ridge portion and spaced apart from the first optical waveguide by the spacer layer, wherein the second optical waveguide is evanescently coupled with the first optical waveguide and configured, in conjunction with the first optical waveguide, to selectively propagate only a first mode of a plurality of optical modes; and an optically active region disposed in one of the first optical waveguide and the second optical waveguide, wherein, when the second surface contacts the first surface, one of the first optical waveguide and the second optical waveguide is optically aligned with the optical component in at least one dimension.

15. The optical system of claim 14, wherein the semiconductor substrate defines one or more mechanical features relative to the second surface, wherein the one of the first optical waveguide and the second optical waveguide is optically aligned with the optical component when the one or more mechanical features are contacted with corresponding portions of the photonic chip.

16. The optical system of claim 14, wherein the first surface is defined by an insulator layer of the photonic chip, and wherein the optical component is formed in the insulator layer.

17. The optical system of claim 16, wherein a cavity is formed in the insulator layer from the first surface, wherein the second surface makes contact with the first surface on opposing sides of the cavity, and wherein the SFW emitter is disposed in the cavity.

* * * * *